(12) United States Patent
Morii et al.

(10) Patent No.: US 11,236,416 B2
(45) Date of Patent: Feb. 1, 2022

(54) SPUTTERING TARGET AND PRODUCTION METHOD THEREFOR

(71) Applicant: JX Nippon Mining & Metals Corporation, Tokyo (JP)

(72) Inventors: Yasushi Morii, Ibaraki (JP); Yoshimasa Koido, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 171 days.

(21) Appl. No.: 16/307,521

(22) PCT Filed: Jun. 7, 2017

(86) PCT No.: PCT/JP2017/021180
§ 371 (c)(1),
(2) Date: Dec. 6, 2018

(87) PCT Pub. No.: WO2017/213185
PCT Pub. Date: Dec. 14, 2017

(65) Prior Publication Data
US 2019/0161851 A1    May 30, 2019

(30) Foreign Application Priority Data

Jun. 7, 2016   (JP) .............................. JP2016-113945

(51) Int. Cl.
*C23C 14/34*   (2006.01)
*C22C 21/00*   (2006.01)
*C22F 1/04*    (2006.01)
*C22C 28/00*   (2006.01)
(Continued)

(52) U.S. Cl.
CPC .......... *C23C 14/3414* (2013.01); *C22C 21/00* (2013.01); *C22C 28/00* (2013.01); *C22F 1/04* (2013.01); *C22F 1/16* (2013.01); *C23C 14/34* (2013.01); *C22F 1/00* (2013.01)

(58) Field of Classification Search
CPC .................................................. C23C 14/3414
See application file for complete search history.

(56) References Cited

U.S. PATENT DOCUMENTS 6,096,438 A    8/2000   Takagi et al.
6,135,198 A *  10/2000  Chu .................... B22D 23/003
                                                  164/429
(Continued)

FOREIGN PATENT DOCUMENTS

EP        855451 A1    7/1998
EP       1553205 A1    7/2005
(Continued)

OTHER PUBLICATIONS

Translation to Maruko (JP 2015-096647) published May 2015.*
(Continued)

*Primary Examiner* — John J Brayton
(74) *Attorney, Agent, or Firm* — Marshall, Gerstein & Borun LLP

(57) ABSTRACT

A sputtering target according to this invention comprises an alloy of Al and Sc and contains from 25 at. % to 50 at. % of Sc. The sputtering target has an oxygen content of 2000 ppm by mass or less, and a variation in Vickers hardness (Hv) of 20% or less.

9 Claims, 6 Drawing Sheets (a)

(b)

(51) Int. Cl.
*C22F 1/16* (2006.01)
*C22F 1/00* (2006.01)

(56) References Cited

U.S. PATENT DOCUMENTS

| | | | |
|---|---|---|---|
| 6,250,362 B1 * | 6/2001 | Rioja | B22D 23/003 164/46 |
| 6,329,275 B1 * | 12/2001 | Ishigami | C22C 21/00 438/584 |
| 9,644,249 B2 * | 5/2017 | Haidar | B22F 9/22 |
| 2001/0007440 A1 * | 7/2001 | Oyama | F01L 3/10 335/200 |
| 2004/0245099 A1 | 12/2004 | Hukushima | |
| 2010/0285332 A1 | 11/2010 | Lin et al. | |
| 2012/0000766 A1 * | 1/2012 | Teshigahara | C23C 14/0036 204/192.15 |
| 2012/0132523 A1 | 5/2012 | Hagihara et al. | |
| 2012/0325655 A1 | 12/2012 | Iwasaki et al. | |
| 2013/0127300 A1 | 5/2013 | Umeda et al. | |
| 2014/0174908 A1 | 6/2014 | Feng et al. | |
| 2015/0290771 A1 * | 10/2015 | Li | B24D 18/0018 51/295 |
| 2016/0064645 A1 | 3/2016 | Teshigahara et al. | |

FOREIGN PATENT DOCUMENTS

| | | |
|---|---|---|
| JP | 2-115364 | 4/1990 |
| JP | H0925564 A | 1/1997 |
| JP | 11-3873 | 1/1999 |
| JP | 2001303243 A | 10/2001 |
| JP | 2003046250 A | 2/2003 |
| JP | 2003166053 A | 6/2003 |
| JP | 2004204284 A * | 7/2004 |
| JP | 2010031378 A | 2/2010 |
| JP | 2011018895 A | 1/2011 |
| JP | 2011179054 A | 9/2011 |
| JP | 2012012673 A | 1/2012 |
| JP | 4997448 B2 | 8/2012 |
| JP | 2015096647 A * | 5/2015 |
| JP | 5817673 B2 | 11/2015 |

OTHER PUBLICATIONS

Translation to Suzuki (JP 2004-204284) published Jul. 2004.*
Extended European Search Report in EP Application No. 17810359.4 dated Nov. 8, 2019, 6 pages.
Kano et al., "Enhancement of Piezoelectric Response in Scandium Aluminum Nitride Alloy Thin Films Prepared by Dual Reactive Co-Sputtering", Advanced Materials, vol. 17, 2012, pp. 202-207.
Search Report in International Application No. PCT/JP2017/021180 dated Sep. 5, 2017, 4 pages.
International Preliminary Report on Patentability and Written Opinion in International Application No. PCT/JP2017/021180 dated Dec. 11, 2018, 9 pages.
Office Action in JP Application No. 2018-521760 dated Nov. 4, 2020.
Office Action in CN Application No. 201780035628.7 dated Apr. 13, 2021, 11 pages.

* cited by examiner

[FIG. 1]
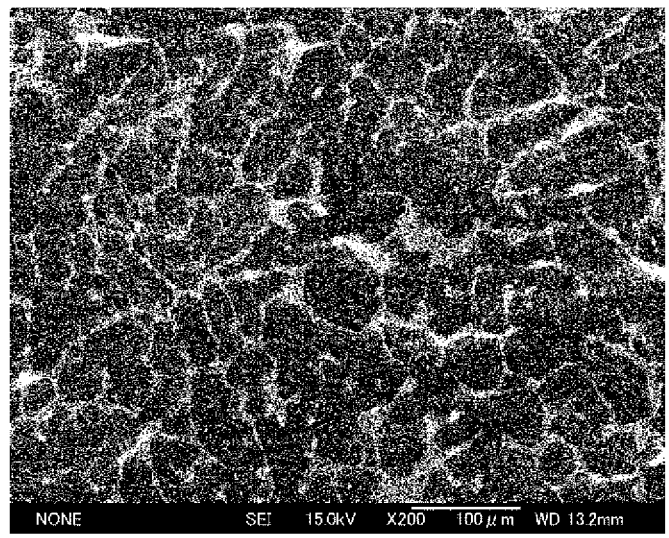
(a)
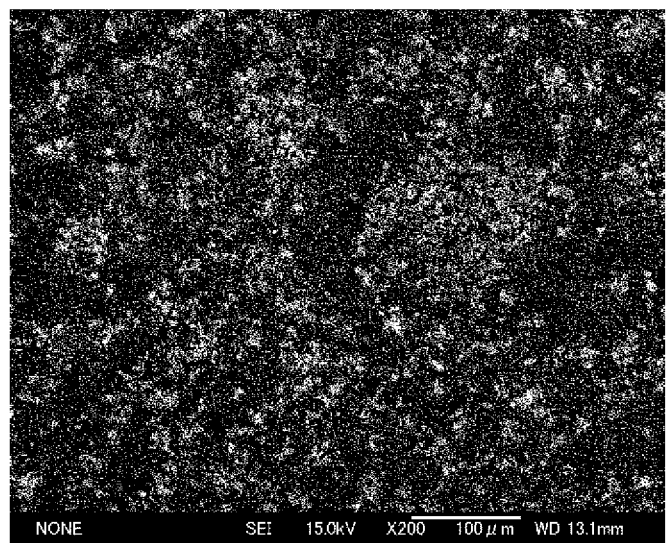
(b)

[FIG. 2]
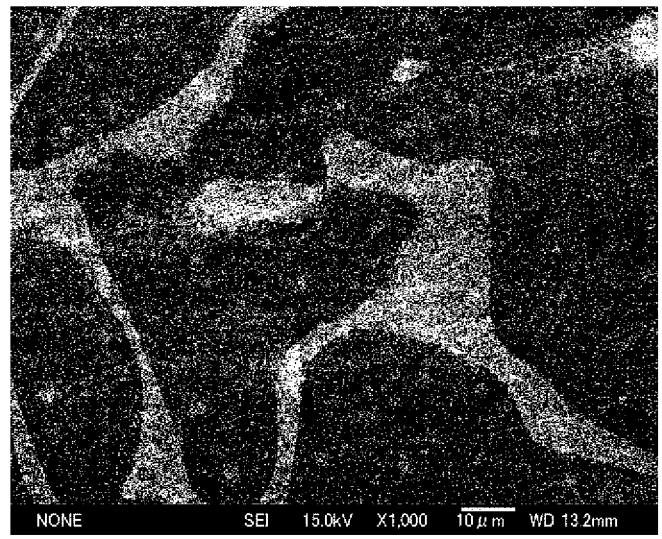
(a)
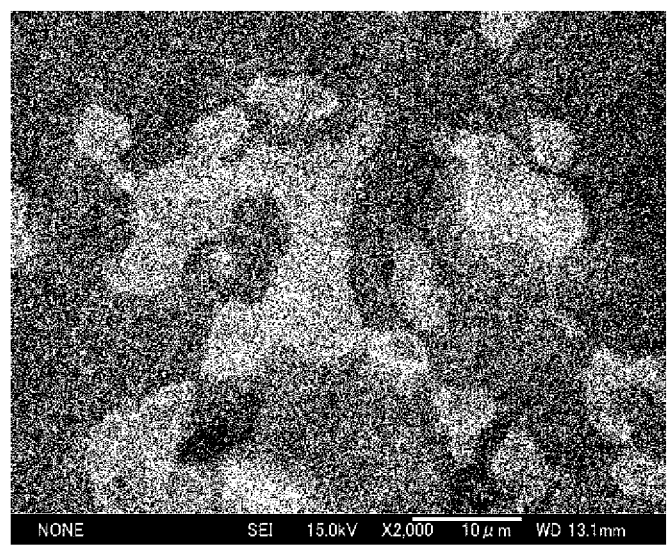
(b)

[FIG. 3]
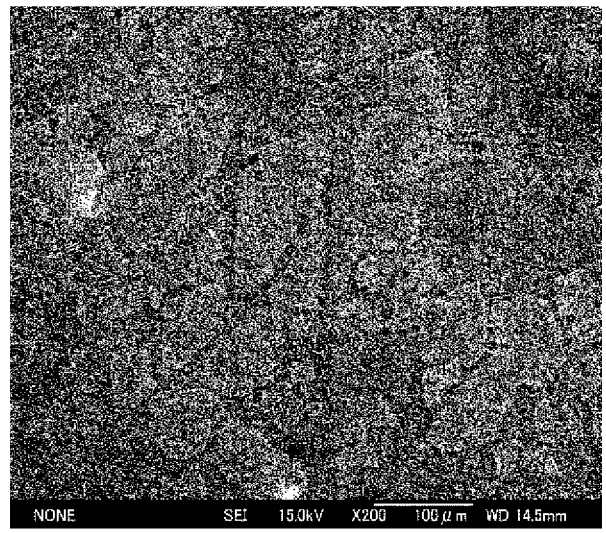
(a)
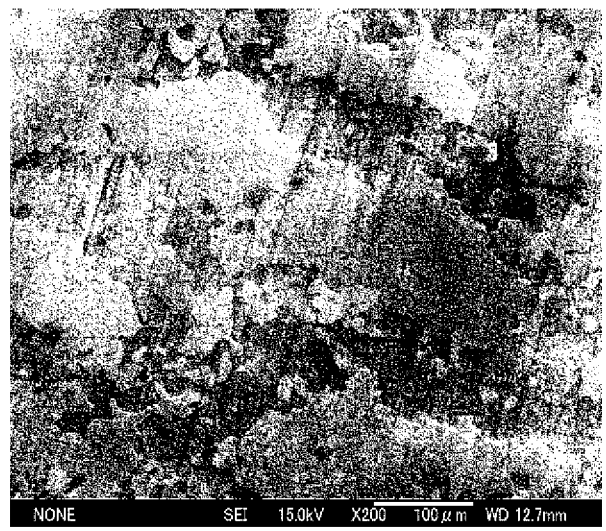
(b)

[FIG. 4]
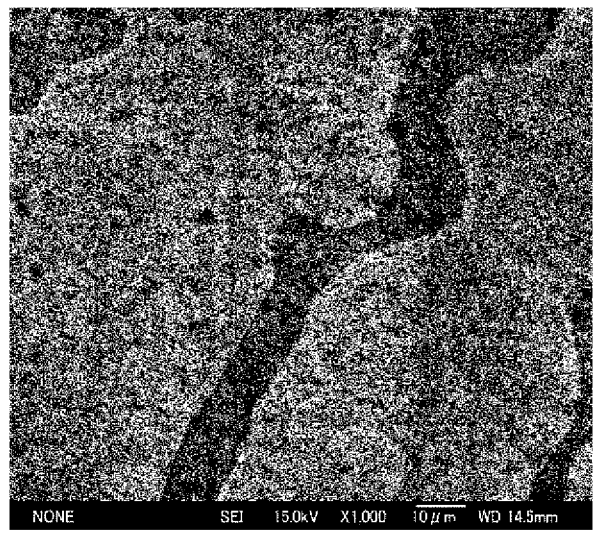
(a)
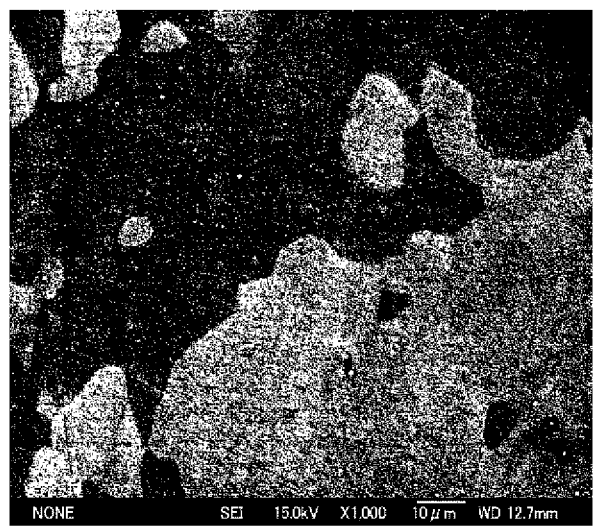
(b)

[FIG. 5]
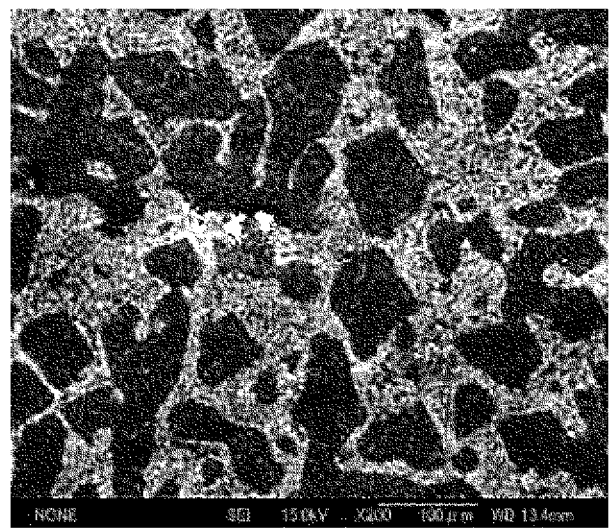
(a)
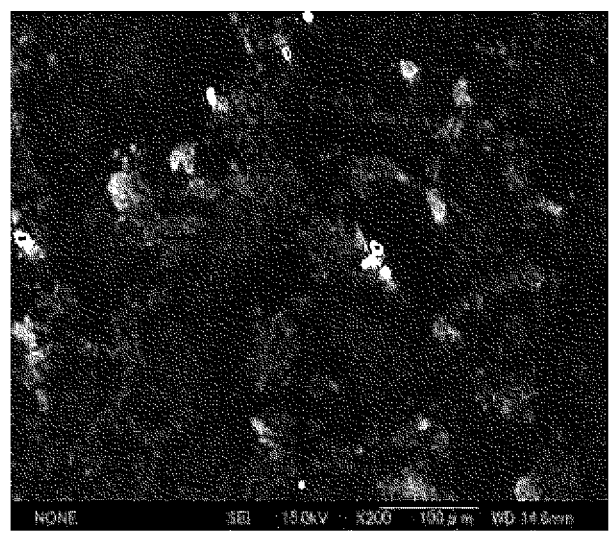
(b)

[FIG. 6]
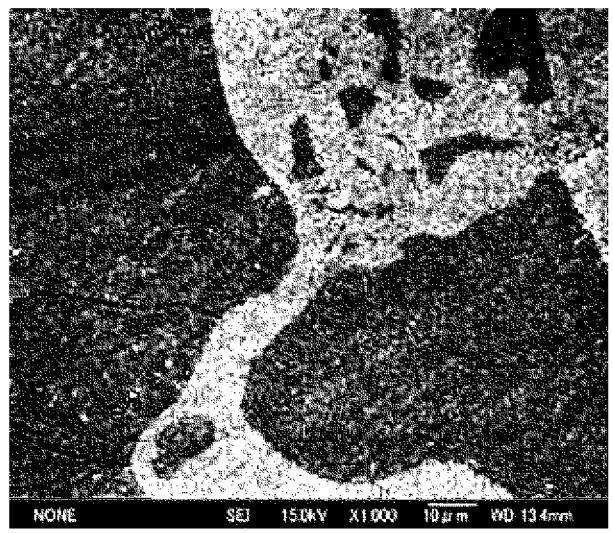
(a)
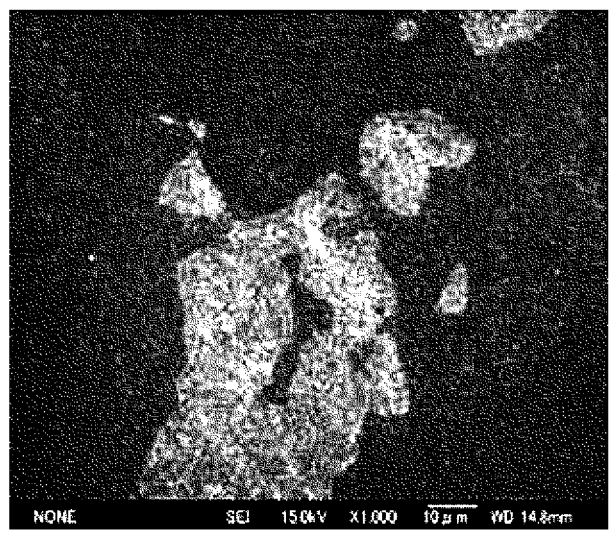
(b)

SPUTTERING TARGET AND PRODUCTION METHOD THEREFOR

TECHNICAL FIELD

The present invention relates to a sputtering target which is made of an alloy of Al and Sc and which is suitable for use in forming a thin film of a piezoelectric material or the like, and to a method for producing the same. In particular, the present invention proposes a technique capable of contributing to improvement of piezoelectric characteristics of a piezoelectric material formed by sputtering.

BACKGROUND ART

A filter made of a piezoelectric material, called a SAW device, is used for wireless communication devices such as mobile phones. The SAW device utilizes a surface acoustic wave (SAW) traveling on a surface of a piezoelectric material to filter unnecessary frequencies through necessary ones, and the device is widely used because it has good characteristics with lower loss and can reduce its size and thickness.

On the other hand, in the SAW devices, a wiring width becomes narrow and a working process becomes difficult when the frequency is increased. Therefore, a film bulk acoustic resonator called an FBAR device (FBAR: Film Bulk Acoustic Resonator) is used in place of the SAW device in order to cope with a recent trend of high frequency band of electric waves. For the resonator, a piezoelectric thin film made of aluminum nitride as well as scandium aluminum nitride may be used. The piezoelectric thin film can be formed by sputtering of an aluminum alloy.

A sputtering target for use in the sputtering for forming the piezoelectric thin film includes sputtering targets comprised of an aluminum alloy obtained by adding to aluminum at least one of copper, titanium, hafnium and palladium; or an aluminum alloy obtained by adding at least one of scandium, yttrium and lanthanoid, as described in Patent Document 1 or the like.

Among them, the aluminum alloy containing scandium has a high piezoelectric constant and can exert good piezoelectric characteristics, particularly when the content of scandium is within a predetermined range, according to Non-patent Document 1 (particularly see FIG. 3). Therefore, it is considered that the sputtering target made of the aluminum alloy containing scandium is effective for forming the above piezoelectric thin film.

Here, Patent Document 2 describes a method for producing scandium-aluminum nitride by means of sputtering on a substrate using a scandium-aluminum alloy. It also discloses that as a target used in the sputtering, metallic aluminum and metallic scandium are used as raw materials, and a $Sc_{0.42}Al_{0.58}$ alloy target is produced by using a vacuum melting method.

CITATION LIST

Patent Literatures

Patent Document 1: Japanese Patent Application Publication No. 2015-96647 A
Patent Document 2: Japanese Patent Application Publication No. 2012-12673 A

Patent Literature

Non-Patent Document 1: Kato, et al., "Enhancement of Piezoelectric Response in Scandium Aluminum Nitride Alloy Thin Films prepared by Dual Reactive Co-Sputtering", DENSO Technical Review, DENSO Corporation, Vol. 202-207, 2012

SUMMARY OF INVENTION

Technical Problem

In order to provide the piezoelectric thin film as described above with good piezoelectric characteristics, it is necessary to reduce oxygen and carbon contained in the sputtering target for forming the thin film.

However, since rare earth metals such as scandium are very active with oxygen, production of a sputtering target made of an alloy containing aluminum and scandium particularly by an atomizing method results in an extremely high oxygen content of about 1.0% by mass. Therefore, with the conventional sputtering target, the piezoelectric characteristics of the piezoelectric thin film could not be improved.

In this regard, the oxygen content of the sputtering target would be able to be reduced by carrying out a melting method instead of the atomizing method as proposed in Patent Document 1.

However, in the melting method it is not possible to select starting materials (fine particles, atomization, and the like) as in a powder method. Therefore, there is a problem that a sputtering target produced by the melting method and containing a relatively large amount of scandium results in a hardness variation over the entire target, so that cracking occurs during sputtering or the like.

Patent Document 2 discloses that a sputtering target made of a scandium-aluminum alloy is produced by a vacuum melting method. However, with the vacuum melting method, it is difficult to uniformly control the composition of scandium. Therefore, in the vacuum melting method, any desired characteristics could not be obtained unless the target has a small diameter.

An object of this invention is to solve such problems of the conventional sputtering targets. The object is to provide a sputtering target which can contribute to improvement of piezoelectric characteristics of a piezoelectric material formed by sputtering, while maintaining a required target hardness, and to provide a method for producing the same.

Solution to Problem

The present inventors have focused on the fact that the oxygen content in the sputtering target can be reduced by producing the sputtering target with the melting method. As a result of extensive studies, the present inventors have obtained new findings that the hardness variation in the produced sputtering target can be significantly reduced by carrying out a predetermined melting method in an inert gas atmosphere and forging an ingot as a target material obtained by the melting method. Based on the new findings, the present inventors have found that a sputtering target can be produced which has a sufficiently low possibility of cracks when used for sputtering or the like, while reducing the oxygen content by employing the melting method.

Based on the findings, the present invention provides a sputtering target comprising an alloy of Al and Sc and containing from 25 at. % to 50 at. % of Sc, the sputtering target having an oxygen content of 2000 ppm by mass or less, and a variation in Vickers hardness (Hv) of 20% or less.

Preferably, in the sputtering target according to the present invention, the oxygen content is 1000 ppm by mass or less.

Preferably, in the sputtering target according to the present invention, the variation in Vickers hardness (Hv) is 5% or less.

The sputtering target according to the present invention preferably has a carbon content of 1000 ppm by mass or less, and more preferably 500 ppm by mass or less.

Preferably, the sputtering target according to the present invention may comprise at least one phase selected from the group consisting of an Al—Sc phase, an $Al_2$—Sc phase and an $Al_3$—Sc phase.

The sputtering target according to the present invention may further contain at least one element selected from the group consisting of Li, Na, K, Fe, Co and Ni in a total amount of 0.1% by mass or less.

The present invention also provides a method for producing a sputtering target, comprising: a melting step of melting, in an inert gas or vacuum atmosphere, an Al raw material together with a Sc raw material having an oxygen content of 3000 ppm by mass or less to obtain an Al—Sc alloy ingot containing from 25 at. % to 50 at. % of Sc; and a forging step of applying a pressure to the ingot to subject the ingot to plastic working.

In the method for producing the sputtering target, a Sc raw material having an oxygen content of from 100 ppm by mass to 3000 ppm by mass is used in the melting step.

Further, in the method for producing the sputtering target, a working ratio of the plastic working in the forging step is preferably from 50% to 95%.

Furthermore, in the forging step, the ingot is preferably subjected to plastic working while heating the ingot at a temperature of from 500° C. to 1200° C.

Advantageous Effects of Invention

According to the present invention, it is possible to obtain a sputtering target having a lower variation in hardness and a lower oxygen content. Thus, the sputtering target has lower possibility of cracking during sputtering and can be effectively used, and also can contribute to improvement of piezoelectric characteristics of a piezoelectric material when performing the sputtering for forming a thin film of the piezoelectric material.

BRIEF DESCRIPTION OF DRAWINGS

FIG. 1(a) is an SEM image of a structure of an ingot according to Example 1 as observed by an electron microscope, and FIG. 1(b) is an SEM image of a structure of a target according to Example 1 as observed by an electron microscope.

FIGS. 2 (a) and (b) are enlarged images of FIGS. 1(a) and (b), respectively.

FIG. 3(a) is an SEM image of a structure of an ingot according to Example 2 as observed by an electron microscope, and FIG. 3(b) is an SEM image of a structure of a target according to Example 2 as observed by an electron microscope.

FIGS. 4(a) and 4(b) are enlarged images of FIGS. 3(a) and 3(b), respectively.

FIG. 5(a) is an SEM image of a structure of an ingot according to Example 3 as observed by an electron microscope, and FIG. 5(b) is an SEM image of a structure of a target according to Example 3 as observed by an electron microscope.

FIGS. 6(a) and 6(b) are enlarged images of FIGS. 5(a) and 5 (b), respectively.

DESCRIPTION OF THE PREFERRED EMBODIMENTS

Embodiments of the present invention will be described below in detail.

A sputtering target according to one embodiment of this invention comprises an alloy of Al and Sc and contains from 25 at. % to 50 at. % of Sc. The sputtering target has an oxygen content of 2000 ppm by mass or less, and a variation in Vickers hardness of 20% or less. The sputtering target generally has a flat plate shape such as a disk, but it may also have various other shapes such as columnar shapes like a cylindrical shape.

(Alloy Element)

The sputtering target may be made of an alloy of aluminum (Al) and scandium (Sc).

In the present invention, Sc is contained in an amount of 25 at. % or more and 50 at. % or less. According to a phase diagram, the AlSc alloy in this range is composed of at least one phase of an Al—Sc phase, an $Al_2$—Sc phase and an $Al_3$—Sc phase, and generally comprised of two phases of them. When the content of Sc is lower, the Al phase will appear. On the other hand, when the content of Sc is higher, the Al—$Sc_2$ phase and/or the Sc phase will appear. Specifically, the content of Sc can be, for example, 25 at. % or more and less than 33 at. %, or 33 at. % or more and 50 at. % or less. According to the phase diagram, when the content of Sc is 25 at. % or more and less than 33 at. %, the AlSc alloy is often comprised of the Al—Sc phase and the $Al_2$—Sc phase, and when the content of Sc is 33 at. % or more and 50 at. % or less, the AlSc alloy is often comprised of the $Al_2$—Sc phase and the $Al_3$—Sc phase.

As an intermetallic compound of aluminum and scandium, the Al—Sc phase and/or $Al_2$—Sc phase is preferably present. The presence or absence of such phases can be confirmed by X-ray diffraction (XRD) or the like.

The sputtering target may contain, in addition to Al and Sc, at least one element selected from the group consisting of Li, Na, K, Fe, Co, and Ni as impurities excluding gas components such as oxygen, nitrogen and carbon. The total content of these elements may preferably be 0.1% by mass or less. If the content of such elements is too large, the piezoelectric characteristics are adversely affected. Therefore, the total content of the elements is preferably 0.1% by mass or less.

(Oxygen Content)

The oxygen content in the sputtering target is 2000 ppm by mass or less. The lower oxygen content can be achieved by producing the target with a melting method as described below.

When a piezoelectric material is formed by the sputtering using the sputtering target with such lower oxygen, the piezoelectric characteristics of the piezoelectric material can be effectively improved by reducing oxygen defects.

In order to further improve the piezoelectric characteristics, the oxygen content is preferably 1500 ppm by mass or less, and more preferably 1000 ppm by mass or less, and particularly 600 ppm by mass or less, and more particularly 300 ppm by mass or less.

(Carbon Content)

A lower carbon content in the sputtering target is also preferable, in terms of improvement of the piezoelectric characteristics. This is due to generation of defects caused by carbide. Therefore, the carbon content is, for example 1000 ppm by mass or less, and preferably 500 ppm by mass or less, and more preferably 100 ppm by mass or less, and further preferably 100 ppm by mass or less, and even more preferably 50 ppm by mass or less.

(Variation in Vickers hardness)

When the sputtering target is produced by a melting method in order to reduce the oxygen content as described above, a variation in Vickers hardness of the entire target will become large, which causes a problem that the sputtering target is broken during the sputtering.

To address this problem, the variation in the Vickers hardness (Hv) of the sputtering target is set to 20% or less by carrying out a forging step as described below after the melting step during the production. Thus, any cracking during the sputtering can be effectively prevented.

For example, in a disk-shaped sputtering target, the variation in Vickers hardness can be calculated by measuring Vickers hardness at each measurement point or the like of the total five measurement points: one point at a target central position and four points in a target outer peripheral position on the target surface, determining an average value and standard deviation of measured values at their multiple measurement points, and then dividing the standard deviation by the average value and expressing it in a percentage. It should be noted that each measurement point in the target outer peripheral position is at a distance of about 15 mm from the outer peripheral end (outer peripheral edge) of the sputtering target. For a flat sputtering target having a rectangular plate shape, the Vickers hardness is measured at the total five points: one point at the target central position and four points at a position having a distance of about 15 mm from a ½ (center) end of each side, and the variation is calculated from the standard deviation and average value.

It should be noted that the Vickers hardness is measured based on a Vickers hardness test defined in JIS Z2244 (2009).

In order to reduce any possibility of cracking during the sputtering, the variation in Vickers hardness may be 20% or less, and preferably 10% or less, and more preferably 5% or less, and further 4% or less, and more particularly 3% or less.

(Production Method)

The sputtering target as stated above can be produced, for example, as follows.

First, an Al raw material and a Sc raw material are mixed together, melted in a melting furnace based on a melting method in a vacuum or an inert gas, and then cooled to obtain an ingot made of an alloy of Al and Sc as a target material. Here, the Sc raw material is added such that the Sc content is from 25 at. % to 50 at. % (25 at. % or more and less than 33 at. %, or 33 at. % or more and 50 at. % or less). It should be noted that the cooling herein can be, for example, natural cooling which is allowed to stand in an inert gas until it reaches room temperature, although the cooling is not limited thereto.

According to such a melting method, the oxygen concentration in the sputtering target produced can be sufficiently reduced, and the composition of scandium can be adjusted to be uniform, by carrying out the melting method in a vacuum or inert gas atmosphere. It should be noted that the oxygen concentration rises in the atmosphere, so it is difficult to obtain a desired ingot. It has been found that in the vacuum atmosphere, the oxygen concentration can be effectively reduced while preventing volatilization of Al and adjusting the composition, because of immediate melting and alloying with high power.

The inert gas used herein may be various gases as long as they are inert gases which do not react with Al and Sc, and it may be nitrogen gas or argon gas, for example.

In particular, the Sc raw material added herein has a lower oxygen content. Thus, the oxygen content in the sputtering target can be further reduced. Specifically, the oxygen content in the Sc raw material can be 3000 ppm by mass or less. The oxygen content in the Sc raw material may be, for example, from 100 ppm by mass to 3000 ppm by mass, and preferably from 100 ppm by mass to 2000 ppm by mass, and more preferably from 100 ppm by mass to 1000 ppm by mass. The carbon content in the Sc raw material is preferably from 10 ppm by mass to 500 ppm by mass, and more preferably from 10 ppm by mass to 100 ppm by mass.

The ingot as described above is subjected to a forging step of applying a pressure to the ingot to subject it to plastic working, thereby producing a sputtering target having a predetermined shape. Only the melting method results in a variation in hardness of the sputtering target and tends to generate cracking during the sputtering. However, by performing the forging step, the structure can be controlled, thereby enabling production of a sputtering target which has a smaller variation in hardness and can be stably sputtered. We have studied the reason why the variation in hardness is decreased by the forging. While not wishing to be bound by any theory, it is believed that the pinning due to grain boundaries will uniformly occur wherever it is measured, and the variation will be thus reduced, because Sc rich phases (white parts as observed in a SEM photograph) were separated so as to form island shapes by the forging, for example in Example 1 described below.

Specifically, for example, the plastic working can be performed by fixing a lower surface of a disk-shaped ingot obtained by the above melting and applying a pressure from the upper surface. Here, to suppress the variation in hardness of the sputtering target to be produced, a working rate of the plastic working in the forging step is preferably from 50% to 95%, and more preferably from 75% to 90%. If the working rate is too low, any sputtering target having Vickers hardness within a predetermined range cannot be obtained. On the other hand, if the working rate is too high, defects will be generated due to working and the defects can be starting points of cracking. The working rate is expressed as a percentage of a value calculated by the equation: (height before working−height after working)/height before working. The number of times of plastic working is not limited to one. That is, the plastic working can be carried out once or several times. For example, in the case of producing a relatively large sputtering target or the like, the plastic working may be performed several times.

Further, since cold-forging of the Al—Sc ingot is difficult, the ingot can be press-forged while being heated at a temperature of from 500° C. to 1200° C.

Processing may be then performed as needed, and a backing plate for supporting the sputtering target can be bonded to one surface of the sputtering target, and the sputtering target can be subjected to finishing such as grinding. For the bonding to the backing plate, for example, brazing with a predetermined element, diffusion bonding or the like can be adopted. The bonding and processing can be carried out in the same way as the known methods.

The sputtering target thus produced has a lower oxygen content. Therefore, when a piezoelectric material is formed by sputtering using the sputtering target, the improvement of the piezoelectric characteristics can be expected. Further, the entire sputtering target has a lower variation in Vickers hardness. Therefore, cracking can be effectively suppressed during the sputtering.

EXAMPLES

The sputtering target according to the present invention was experimentally produced and its effects were confirmed as described below. However, the description herein is merely for the purpose of illustration and is not intended to be limited thereto.

Example 1

An Al raw material and a Sc raw material were mixed such that a Sc content was 38 at. %, and the mixture was subjected to melting at a melting point of 1150° C. by high-frequency heating in an Ar atmosphere, and a power was turned off and the mixture was left for 2 hours in the inert gas to naturally cool the mixture to produce an ingot made of an alloy of Al and Sc. Here, the carbon content in the Sc raw material was 40 ppm by mass and the oxygen content was 1400 ppm by mass. A forging step was then performed, and the ingot was subjected to one press working at a working rate of 85% while heating the ingot at 1000° C. in an Ar atmosphere, and then subjected to the required processing to form a sputtering target.

The Sc content in the sputtering target was measured, indicating that the Sc content was as shown in Table 1, and a variation in the Sc content at each position was within a range of ±2 at. %. Impurities contained in the sputtering target are shown in Table 2 together with their contents. In Tables 1 and 2, TOP means a top surface of the target, and BTM means a bottom surface of the target on a back side of the top surface of the target.

TABLE 1

| Sc Content | at % |
|---|---|
| Goal | 38 |
| TOP | 38 |
| BTM | 36.9 |

TABLE 2

| Impurities | TOP (at. ppm) | BTM (at. ppm) |
|---|---|---|
| Li | <0.01 | <0.01 |
| Na | 0.01 | <0.01 |
| K | 0.03 | <0.01 |
| Fe | 290 | 320 |
| Co | 10 | 10 |
| Ni | 160 | 150 |

The carbon content and the oxygen content in the sputtering target were measured, indicating that measured values were as shown in Table 3. Analysis was carried out by an inert gas melting method and oxygen was detected with an infrared detector. Equipment used herein is TC 600 and TCH 600 available from LECO CORPORATION. The content was measured twice, and an average value of measured values is shown in Table 3.

It is understood from Table 3 that the oxygen content in the produced sputtering target was effectively reduced. The carbon content and the oxygen content in the sputtering target are substantially the same as the carbon content and the oxygen content in the ingot shown in Table 3.

TABLE 3

| | Raw Material Sc (ppm by mass) | AlSc Ingot TOP (ppm by mass) | AlSc Ingot BTM (ppm by mass) |
|---|---|---|---|
| C | 40 | 30 | 30 |
| O | 1400 | 490 | 410 |

Further, for each of the ingot and the sputtering target obtained by forging the ingot, the Vickers hardness was measured at total five points: one point at the central position of the ingot or the target and four points (positions of 0°, 90°, 180°, and 270°) on the outer peripheral portion of the ingot or the target, and an average value and standard deviation were calculated for each of the target or the ingot. In this case, positions of 10 mm away from the outer peripheral end of the disk-shaped ingot or target were determined to be the measurement points for the outer circumferential position of the ingot or target. The results are shown in Table 4. As can be seen from Table 4, in Example 1, the variation in the Vickers hardness of the target was 3.2%, which was confirmed to be 20% or less. It can be seen that the variation in the Vickers hardness, which was a value obtained by dividing the standard deviation by the average value and expressing it as a percentage, was effectively suppressed by the forging.

TABLE 4

| Vickers Hardness Hv | Ingot | Target |
|---|---|---|
| Average Value | 556.5 | 588.3 |
| Standard Deviation | 72.7 | 18.7 |
| Variation (%) | 13.1 | 3.2 |

For Example 1, FIG. 1(a) shows an SEM image of the structure of the ingot as observed by an electron microscope, and FIG. 1(b) shows an SEM image of the structure of the target as observed by an electron microscope. FIGS. 2(a) and 2(b) are enlarged images of FIGS. 1(a) and 1(b), respectively. In these figures, the white band parts are Sc rich (AlSc) parts, and the black parts are Al rich ($Al_2Sc$) parts.

Example 2

A sputtering target was produced by substantially the same method as that of Example 1, with the exception that an Al raw material and a Sc raw material were mixed such that the Sc content was 30 at. %, and measured for the Sc content, contents of impurities, carbon content and oxygen content, as well as Vickers hardness, by the same methods as those of Example 1. The results are shown in Tables 5 to 8, respectively.

TABLE 5

| Sc Content | at % |
|---|---|
| Goal | 30 |
| TOP | 29.8 |
| BTM | 31.4 |

TABLE 6

| Impurities | TOP (at. ppm) | BTM (at. ppm) |
|---|---|---|
| Li | <0.01 | <0.01 |
| Na | 0.25 | 0.10 |
| K | 0.02 | <0.01 |
| Fe | 120 | 96 |
| Co | <1 | <1 |
| Ni | 30 | 23 |

TABLE 7

| | Raw Material Sc (ppm by mass) | AlSc Ingot TOP (ppm by mass) | AlSc Ingot BTM (ppm by mass) |
|---|---|---|---|
| C | 80 | 30 | <10 |
| O | 620 | 490 | 370 |

TABLE 8

| Vickers Hardness Hv | Ingot | Target |
|---|---|---|
| Average Value | 430.1 | 448.4 |
| Standard Deviation | 94.5 | 84.8 |
| Variation (%) | 22.0 | 18.9 |

As shown in Table 8, in Example 2, the variation in the Vickers hardness of the target was 18.9%, which was confirmed to be 20% or less. Also in Example 2, it is understood that the variation in Vickers hardness were effectively suppressed by the forging after the melting and casting.

In addition, for Example 2, FIG. 3(a) shows an SEM image of the structure of the ingot as observed by an electron microscope, and FIG. 3(b) shows an SEM image of the structure of the target as observed by an electron microscope. FIGS. 4(a) and 4(b) are enlarged images of FIGS. 3(a) and 3(b), respectively. In the figures, the white band parts are Sc rich (Al$_2$Sc) parts, and the black parts are Al rich (Al$_3$Sc) parts.

Example 3

A sputtering target was produced by substantially the same method as that of Example 1, with the exception that a Sc raw material having a higher oxygen concentration was used, and measured for the Sc content, contents of impurities, carbon content and oxygen content, as well as Vickers hardness, by the same methods as those of Example 1. The results are shown in Tables 9 to 12, respectively.

TABLE 9

| Sc Content | at % |
|---|---|
| Goal | 38 |
| TOP | 39.9 |
| BTM | 38.7 |

TABLE 10

| Impurities | TOP (at. ppm) | BTM (at. ppm) |
|---|---|---|
| Li | <0.01 | <0.01 |
| Na | <0.01 | <0.01 |
| K | 1.1 | 1.4 |
| Fe | 360 | 370 |
| Co | <1 | <1 |
| Ni | 18 | 17 |

TABLE 11

| | Raw Material Sc (ppm by mass) | AlSc Ingot TOP (ppm by mass) | AlSc Ingot BTM (ppm by mass) |
|---|---|---|---|
| C | 200 | 90 | 80 |
| O | 2800 | 1920 | 1630 |

TABLE 12

| Vickers Hardness Hv | Ingot | Target |
|---|---|---|
| Average Value | 512.5 | 548.5 |
| Standard Deviation | 80.4 | 37.3 |
| Variation (%) | 15.7 | 6.8 |

As shown in Table 12, in Example 3, the variation in the Vickers hardness of the target was 6.8%, which was confirmed to be 20% or less. Also in Example 3, it is clear that the variation in the Vickers hardness was effectively suppressed by the forging after the melting and casting, as compared with the value of the variation in the Vickers hardness of the ingot.

For Example 3, FIG. 5(a) shows an SEM image of the structure of the ingot as observed by an electron microscope, and FIG. 5(b) shows a SEM image of the structure of the target as observed by an electron microscope. FIGS. 6(a) and (b) are enlarged images of FIGS. 5(a) and 5(b), respectively. In the figures, the white band parts are Sc rich (Al$_2$Sc) parts, and the black parts are Al rich (Al$_3$Sc) parts.

As described above, it is found that according to the present invention, a sputtering target having lower oxygen and a lower variation in hardness can be produced, thereby contributing to improvement of piezoelectric characteristics of a piezoelectric material formed by sputtering, and preventing cracking during the sputtering.

What is claimed is:

1. A sputtering target comprising an alloy of Al and Sc and containing from 25 at. % to 50 at. % of Sc, the sputtering target having an oxygen content of 2000 ppm by mass or less, and a variation in Vickers hardness (Hv) of 20% or less, wherein:
   the variation in Vickers hardness (Hv) is calculated by measuring Vickers hardness at a plurality of measurement points on a target surface, determining an average value and standard deviation of measured values at the measurement points, dividing the standard deviation by the average value, and expressing in a percentage, and
   the sputtering target comprises at least one phase selected from the group consisting of an Al—Sc phase and an Al$_2$—Sc phase.

2. The sputtering target according to claim 1, wherein the oxygen content is 1000 ppm by mass or less.

3. The sputtering target according to claim 1, wherein the variation in Vickers hardness (Hv) is 5% or less.

4. The sputtering target according to claim 1, wherein the sputtering target has a carbon content of 1000 ppm by mass or less.

5. The sputtering target according to claim 1, further containing at least one element selected from the group consisting of Li, Na, K, Fe, Co, and Ni in a total amount of 0.1% by mass or less.

6. A method for producing a sputtering target, comprising:
   a step of melting, in an inert gas or vacuum atmosphere, an Al raw material together with a Sc raw material having an oxygen content of 3000 ppm by mass or less and then cooling to obtain an Al—Sc alloy ingot containing from 25 at. % to 50 at. % of Sc; and
   a forging step of applying a pressure to the ingot to subject the ingot to plastic working,
   wherein the sputtering target comprises at least one phase selected from the group consisting of an Al—Sc phase and an Al$_2$—Sc phase.

7. The method for producing the sputtering target according to claim 6, wherein a Sc raw material having an oxygen content of from 100 ppm by mass to 3000 ppm by mass is used in the step of melting.

8. The method for producing the sputtering target according to claim 6, wherein a working ratio of the plastic working in the forging step is from 50% to 95%.

9. The method for producing the sputtering target according to claim 6, wherein in the forging step, the ingot is subjected to plastic working while heating the ingot at a temperature of from 500° C. to 1200° C.

* * * * *